(12) United States Patent
Uchiyama et al.

(10) Patent No.: US 10,916,441 B2
(45) Date of Patent: Feb. 9, 2021

(54) METHOD FOR PRODUCING SEMICONDUCTOR CHIPS

(71) Applicant: FURUKAWA ELECTRIC CO., LTD., Tokyo (JP)

(72) Inventors: Tomoaki Uchiyama, Tokyo (JP); Akira Akutsu, Tokyo (JP); Hirotoki Yokoi, Tokyo (JP)

(73) Assignee: FURUKAWA ELECTRIC CO., LTD., Tokyo (JP)

(*) Notice: Subject to any disclaimer, the term of this patent is extended or adjusted under 35 U.S.C. 154(b) by 0 days.

(21) Appl. No.: 16/539,687

(22) Filed: Aug. 13, 2019

(65) Prior Publication Data

US 2019/0371618 A1 Dec. 5, 2019

Related U.S. Application Data

(63) Continuation of application No. PCT/JP2018/041218, filed on Nov. 6, 2018.

(30) Foreign Application Priority Data

Nov. 9, 2017 (JP) .................................. 2017-216087

(51) Int. Cl.
*H01L 21/311* (2006.01)
*H01L 21/308* (2006.01)
(Continued)

(52) U.S. Cl.
CPC .... *H01L 21/31133* (2013.01); *H01L 21/3086* (2013.01); *H01L 21/6836* (2013.01);
(Continued)

(58) Field of Classification Search
CPC ........... H01L 21/31133; H01L 21/3086; H01L 21/6836; H01L 21/78; H01L 21/3065;
(Continued)

(56) References Cited

U.S. PATENT DOCUMENTS 5,858,106 A * 1/1999 Ohmi ........................ B08B 3/02
134/1
6,180,742 B1 1/2001 Kato et al.
(Continued)

FOREIGN PATENT DOCUMENTS

JP   S62101678 A   5/1987
JP   S63153814 A   6/1988
(Continued)

OTHER PUBLICATIONS

International Search Report issued in PCT Patent Application No. PCT/JP2018/041218 dated Feb. 12, 2019.
(Continued)

*Primary Examiner* — Syed I Gheyas
(74) *Attorney, Agent, or Firm* — Marshall, Gerstein & Borun LLP

(57) ABSTRACT

A surface side is irradiated with an $SF_6$ gas plasma to etch a semiconductor wafer which has been peeled off in street portions, and divide the semiconductor wafer into a plurality of individual semiconductor chips. A removing agent is subsequently supplied from the surface side. At that time, it is preferable that the semiconductor wafer divided into the plurality of chips is rotated at high speed. Accordingly, a mask material layer remaining on the surface is removed by the removing agent. Moreover, the removing agent is preferably an organic solvent, and more preferably, methyl ethyl ketone, ethanol, and ethyl acetate, or a combination of these.

3 Claims, 7 Drawing Sheets

(51) Int. Cl.
*H01L 21/683* (2006.01)
*H01L 21/78* (2006.01)
*H01L 21/3065* (2006.01)

(52) U.S. Cl.
CPC .......... *H01L 21/78* (2013.01); *H01L 21/3065* (2013.01); *H01L 2221/68327* (2013.01); *H01L 2221/68386* (2013.01)

(58) Field of Classification Search
CPC . H01L 2221/68327; H01L 2221/68386; H01L 21/3081; H01L 2221/68381; H01L 2221/6834; H01L 21/02041; H01L 21/304; H01L 21/67092; H01L 21/67132; H01L 21/68764; H01L 21/76; C09J 201/00; B23K 26/38
See application file for complete search history.

(56) References Cited

U.S. PATENT DOCUMENTS

2011/0008597 A1   1/2011   Asai et al.
2014/0211334 A1   7/2014   Yoshibayashi et al.
2017/0054062 A1*  2/2017   Tamaki ................. H01L 33/507

FOREIGN PATENT DOCUMENTS

| JP | H10226776 A | 8/1998 |
| JP | 2003-332310 A | 11/2003 |
| JP | 2007-19385 A | 1/2007 |
| JP | 2010-161212 A | 7/2010 |
| JP | 2010-165963 A | 7/2010 |
| JP | 2011-23396 A | 2/2011 |
| JP | 2013-076782 A | 4/2013 |
| JP | 2014-203954 A | 10/2014 |
| JP | 2016-171263 A | 9/2016 |
| JP | 2016171263 A * | 9/2016 |

OTHER PUBLICATIONS

Office Action issued in Taiwanese Patent Application No. 107139663 dated Jul. 2, 2019.
Decision to Grant a Patent issued in Japanese Patent Application No. 2017-216087 dated Dec. 12, 2019.

* cited by examiner

METHOD FOR PRODUCING SEMICONDUCTOR CHIPS

TECHNICAL FIELD

The present invention relates to a method for producing a semiconductor chip.

BACKGROUND

In recent years, considerable progress has been made in thinning and downsizing of semiconductor chips. In particular, IC cards including semiconductor IC chips, such as a memory card and a smart card, require thinning of the chips, and LED/LCD drive devices or the like require downsizing of the chips. With increase in demands for these products, it is considered that there will be even more needs for thinning and downsizing of semiconductor chips in the future.

These semiconductor chips are obtained by reducing a thickness of a semiconductor wafer to a predetermined thickness through processes such as backgrinding and etching and then divided into individual chips through a dicing process. In such a dicing process, a blade-dicing method in which a dicing blade is used to cut the wafer has been in use. In the blade-dicing method, cutting resistance from the blade is directly applied to the semiconductor wafer at the time of cutting. Thus, this cutting resistance may cause the semiconductor chip to have a micro chipping. The occurrence of the chipping not only impairs appearance of the semiconductor chip but also may invite chip breakage at the time of pickup due to insufficient transverse strength in some cases and may possibly damage circuit patterns on the chip. Also, in the dicing process of physically dicing with a blade, it is impossible to decrease a width of a kerf (also called as a scribe line or a street), which is a space between two chips, less than a blade width having a thickness. As a result, the number of chips that can be obtained from a wafer (an yield) is small. Furthermore, long processing time of the wafer has also been an issue.

Other than the blade-dicing method, various methods have been used as the dicing process. For example, in view of difficulty in dicing after thinning a wafer, there is a DBG (dicing before grinding) method, in which grooves of a predetermined depth are formed in the wafer in advance and then grinding process is performed thereto so that thinning the chip and dividing the chip into individual pieces are performed simultaneously. In this method, although the kerf width is the same as in the blade-dicing process, the transverse strength of the chip is improved and breakage of the chip can be prevented.

Also, there is a laser dicing method in which dicing is performed by a laser. The laser dicing method can make the kerf width smaller and also has an advantage that the process can be a dry process. However, there is an inconvenience that the wafer surface may be contaminated with a sublimate from the laser cutting, and thus a pretreatment for protecting the wafer surface using a predetermined liquid protective material may be required in some cases. Also, although it is called as a dry process, a complete dry process has not been achieved yet. Furthermore, the process speed can be faster in the laser dicing method than in the blade-dicing method. However, line-by-line processing remains the same, and manufacturing of microchips still requires a certain amount of time.

Also, there are methods using wet process such as a water jet method in which dicing is performed using water pressure. This method may cause a problem for materials such as a MEMS device or CMOS sensor in which prevention of surface contamination is highly essential. Also, there is a limit in reducing of the kerf width, and the yield of the obtained chip may be low.

Also, there has been a stealth dicing method in which a modifying layer is formed in a thickness direction of the wafer by using a laser and the wafer is expanded to fracture for separation. This method has an advantage that the kerf width can be zero with a dry process. However, the transverse strength of the chip may tend to decrease due to thermal history during formation of the modifying layer, and also there may be silicon debris generated at the time of expansion and separation. Furthermore, collision between neighboring chips may lead to insufficiency in the transverse strength.

Furthermore, as a method that combines the stealth dicing and the DBG, there is a chip dicing method for narrow scribe width in which a modifying layer is formed for a predetermined thickness before thinning and then grinding process is performed onto the back surface thereof so as to perform thinning and separating of the chip at the same time. With this technique, the disadvantages of the above processes are improved. The silicon modifying layer cleaves due to stress force during the grinding process of the back surface of the wafer so as to separate the wafer into dies and this leads to advantages such as zero kerf width, high yield of the chip, and enhanced transverse strength. However, since the wafer is separated during the grinding process of the back surface, there may be, in some cases, a phenomenon in which neighboring chip end faces collide with each other, causing chipping off of corners of the chips.

Also, a dicing technology using plasma dicing method has been proposed (see Japanese Unexamined Patent Application Publication No. 2007-19385 (JP-A-2007-19385), for example). The plasma dicing method divides the semiconductor wafer by plasma, which selectively etches regions that are not masked. This dicing method enables to separate chips selectively and allows the separation without any problems even if the scribe line is not straight. Also, since its etching rate is extremely high, the plasma dicing method has been considered as one of the most suitable processes for dividing chips in recent years.

In the plasma dicing method, fluorine gas such as sulfur hexafluoride ($SF_6$) or carbon tetrafluoride ($CF_4$) having an extremely high reactivity with the wafer is used as a plasma generating gas. Thus, the etching rate is high and areas that are not to be etched must be protected by a mask.

To form this mask, as being described in Japanese Unexamined Patent Application Publication No. 2007-19385 (JP-A-2007-19385), a technology in which photoresist is applied onto a surface of the wafer and then photolithography process removes the areas corresponding to streets has been commonly used. Thus, to perform the plasma dicing, other than equipment for plasma dicing, equipment for photolithography process is also required, which leads to a problem of a rise in the chip cost. Also, there also has been an inconvenience that the whole treatment process takes a long time because the process needs to go through masking steps with photoresist.

SUMMARY OF THE DISCLOSURE

The present invention was made in view of such problems. Its object is to provide a method for producing semiconductor chips, in which photolithography is not necessary and plasma irradiation can divide (separate) a wafer into chips with more certainty, highly suppressing occurrence of defective chips.

To achieve the above object, the present invention provides a method for producing semiconductor chips, including a step a of pasting a mask-integrated surface-protective tape, which includes a surface protective tape and a mask material layer being provided on the surface protective tape, over a patterned surface side of a semiconductor wafer, grinding a back surface of the semiconductor wafer, laminating a wafer fixing tape onto the grinded back surface of the semiconductor wafer, and fixing and supporting the semiconductor wafer with a ring frame; a step b of peeling off the surface protective tape from the mask-integrated surface-protective tape to expose the mask material layer to the surface, and then cutting a part of the mask material layer that corresponds to a street of the semiconductor wafer by using a laser to make an opening for the street of the semiconductor wafer; a step c of plasma dicing in which plasma irradiation cuts the semiconductor wafer at the street and separates the semiconductor wafer into semiconductor chips; and a step d of removing the mask material layer by using a removing agent.

The removing agent is preferably an organic solvent.

The organic solvent is preferably selected from the group constituting of methyl ethyl ketone, ethanol, ethyl acetate, and any combination thereof.

It is preferable that, in the step d, the removing agent is supplied from above while rotating the separated semiconductor wafer.

According to the present invention, plasma irradiation can divide a wafer into chips and thus occurrence of defective chips can be suppressed. At this time, since a mask is formed by using the mask-integrated surface protective tape having the mask material layer on the surface protective tape, photolithography process is not necessary. Thus, equipment for photolithography process is unnecessary, which can reduce the chip cost. Also, a masking process with photoresist is unnecessary and thus the whole treatment process can be shortened.

Also, the mask material layer is removed by using a removing agent and thus, compared with a case in which the mask material layer is removed by ashing for example, damages to a circuit patterned surface of the semiconductor wafer can be prevented.

Also, using an organic solvent as a removing agent can remove the mask material layer with certainty. In particular, if the removing agent is selected from the group constituting of methyl ethyl ketone, ethanol, ethyl acetate, and any combination thereof, the mask material layer can be removed more efficiently with certainty.

Also, the removing agent is supplied from above while rotating the separated semiconductor wafer to remove the mask material layer. This can prevent the removing agent from accumulating on the wafer fixing tape, reducing influence of the removing agent to the wafer fixing tape, and, in addition, it is easy to remove the dissolved or peeled mask material layer from the semiconductor wafer.

The present invention can provide a method for producing semiconductor chips, in which photolithography process is not necessary and plasma irradiation can divide (separate) a wafer into chips with more certainty, highly suppressing occurrence of defective chips.

DETAILED DESCRIPTION

Figure 1:
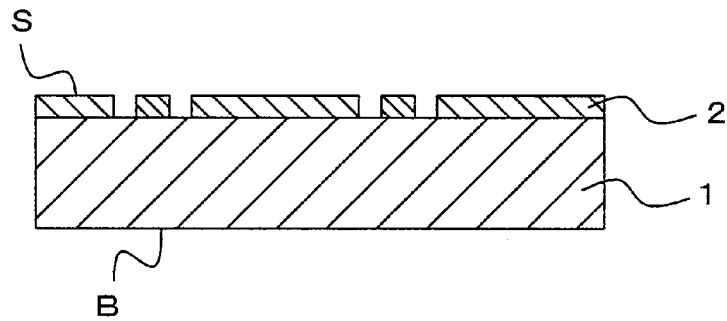
FIG. 1A is a view showing a semiconductor wafer 1 and is a schematic cross sectional view illustrating a step before pasting of a mask-integrated surface-protective tape 3 onto the semiconductor wafer 1.
FIG. 1B is a view showing pasting of the mask-integrated surface-protective tape 3 onto the semiconductor wafer 1.
FIG. 1C is a view showing the semiconductor wafer 1 pasted with the mask-integrated surface-protective tape 3.
Figure 1:
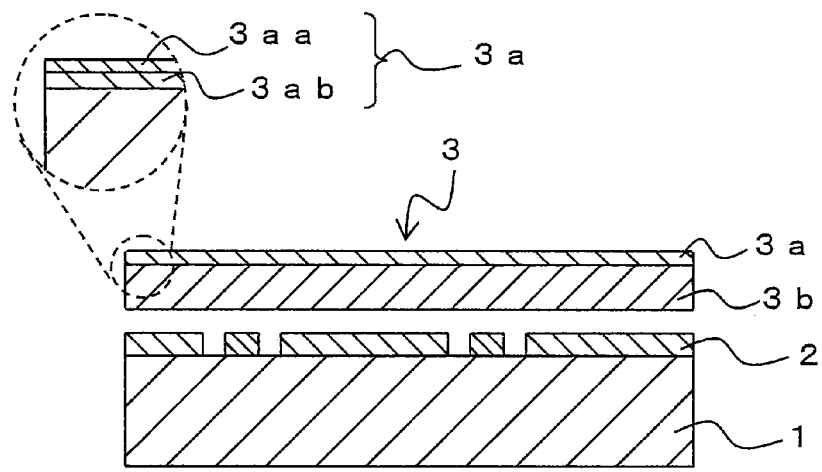
Figure 1:
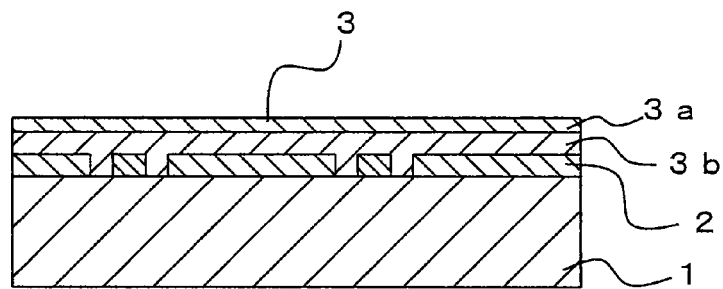
Figure 2:
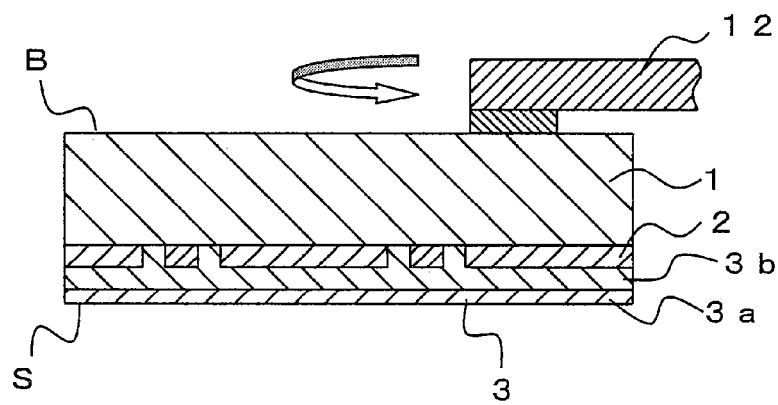
FIG. 2A is a schematic cross sectional view illustrating one of steps up to thinning and fixing of the semiconductor wafer 1 and is a view showing a thinning process of the semiconductor wafer 1.
FIG. 2B is a view showing laminating of a wafer fixing tape 4.
FIG. 2C is a view showing a state in which the semiconductor wafer 1 is fixed to a ring frame 13.
Figure 2:
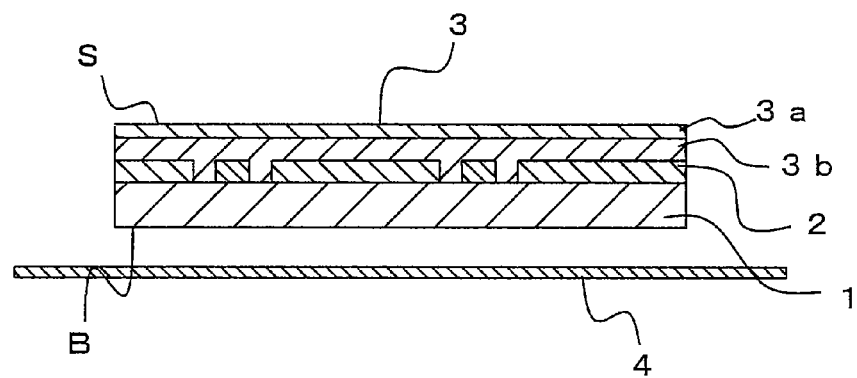
Figure 2:
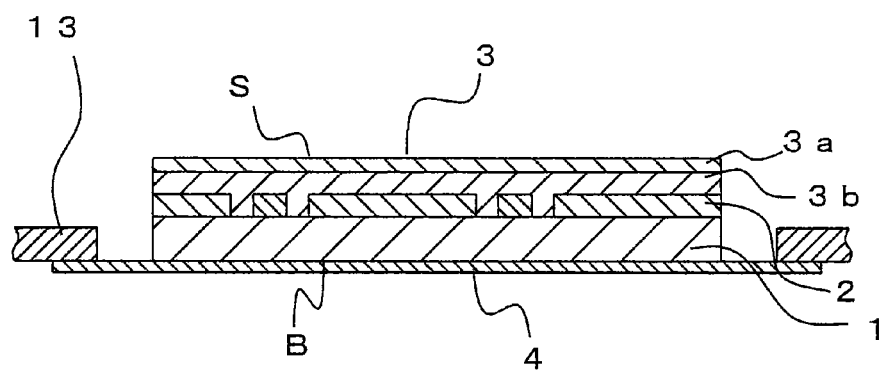
Figure 3:
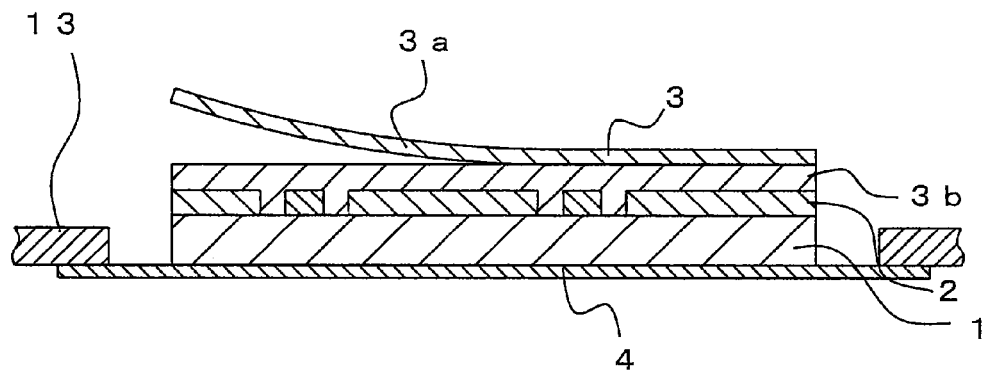
FIG. 3A is a schematic cross sectional view illustrating one of steps up to mask formation and is a view showing a state in which a surface protective tape 3a is peeled off from the mask-integrated surface-protective tape 3 leaving a mask material layer 3b behind.
FIG. 3B is a view showing a state in which the mask material layer 3b of the mask-integrated surface-protective tape 3 is being exposed.
FIG. 3C is a view showing a step in which a laser L cuts areas of the mask material layer 3b that correspond to streets.
Figure 3:
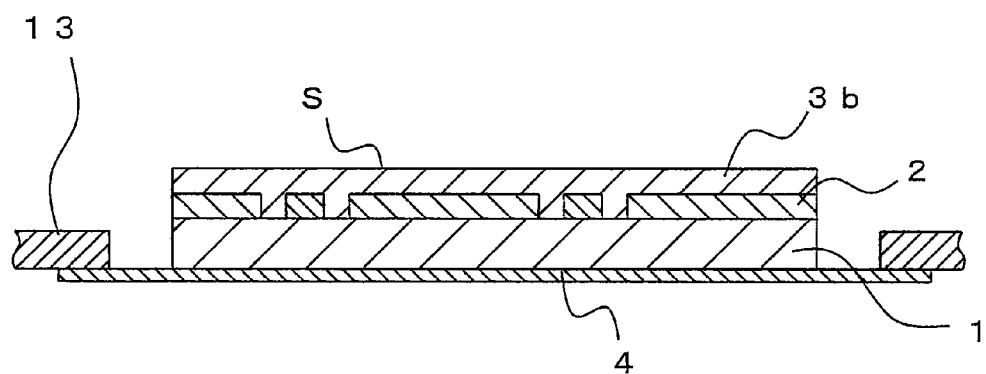
Figure 3:
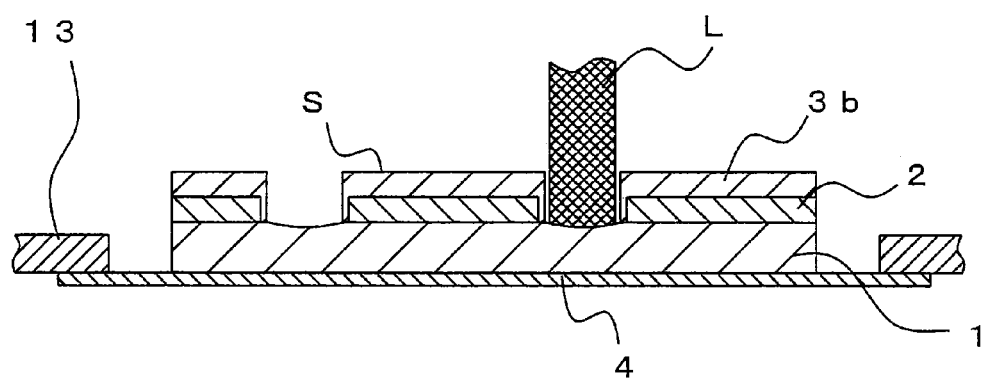
Figure 4:
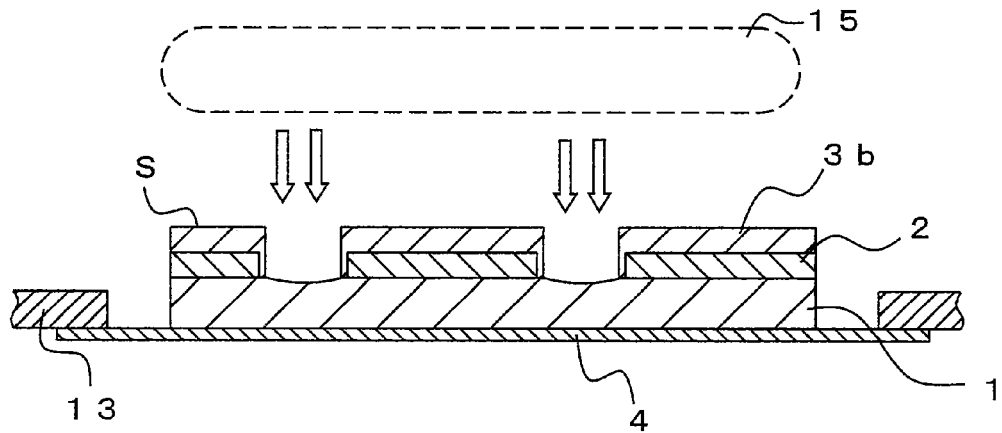
FIG. 4A is a schematic cross sectional view illustrating a plasma dicing process and a mask removal process, and is a view showing a state in which plasma dicing is performed.
FIG. 4B is a view showing a state in which the semiconductor wafer 1 is divided into chips 7.
FIG. 4C is a view showing a state in which the mask material layer 3b is removed by using a removing agent 16.
Figure 4:
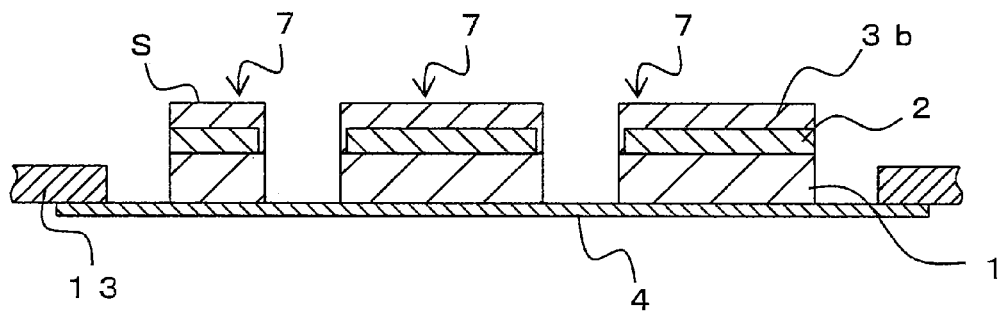
Figure 4:
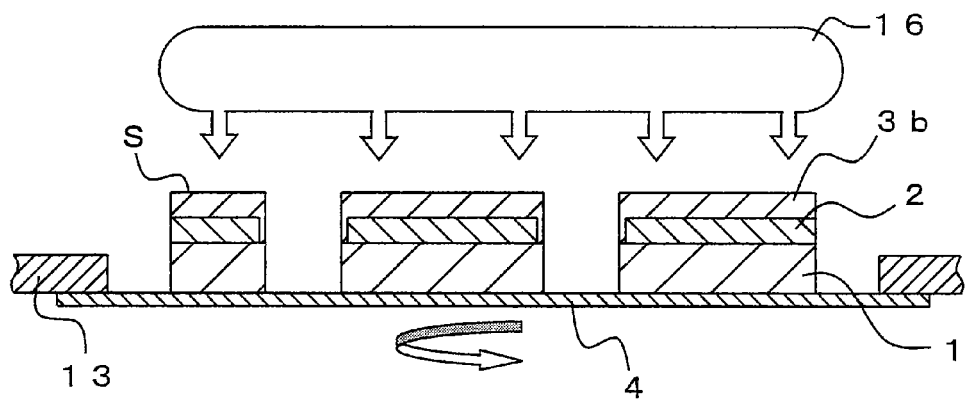
Figure 5:
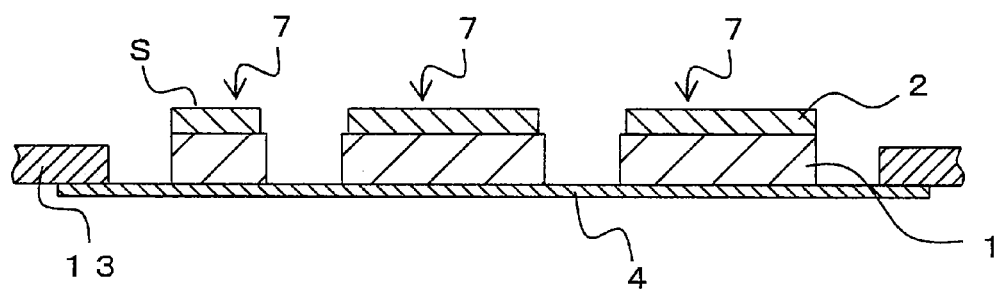
FIG. 5A is a schematic cross sectional view illustrating one of steps up to picking up the chip and is a view showing a state in which the mask material layer 3b is removed.
FIG. 5B is a view showing a state in which the chip 7 is picked up.
Figure 5:
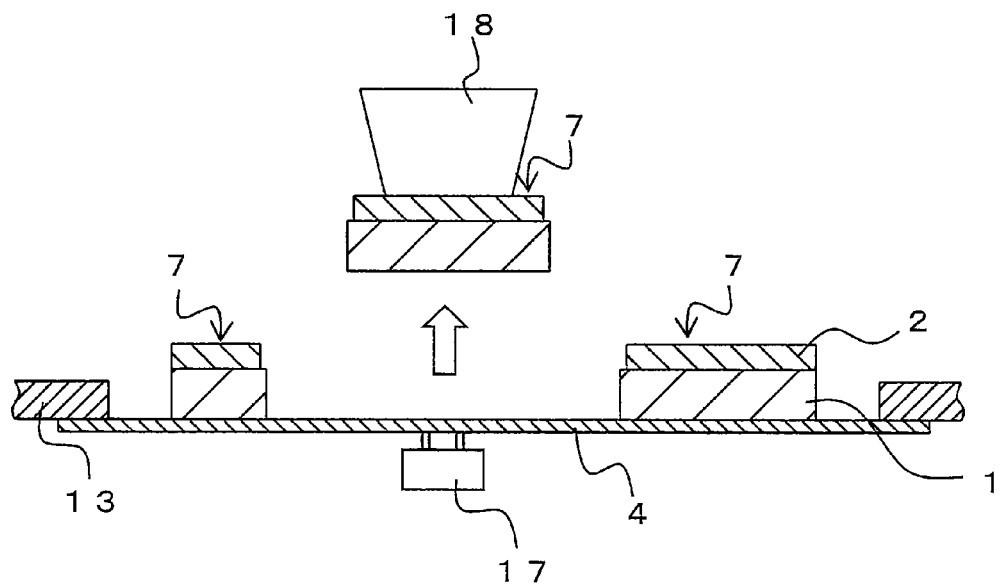

[A Method for Producing Semiconductor Chips According to the Present Invention]

Hereinafter, a method for producing semiconductor chips according to the present invention (hereinafter, simply referred to as 'the producing method of the present invention') will be described. The producing method of the present invention is a method in which semiconductor chips are obtained from plasma dicing a semiconductor wafer. As described hereinafter, the producing method of the present invention does not need photolithography process and thus can considerably reduce the cost for producing semiconductor chips or semiconductor products.

The producing method of the present invention includes at least following processes (a) to (d).

(a): a process of pasting a mask-integrated surface-protective tape, which includes a surface protective tape and a mask material layer being provided on the surface protective tape, onto a patterned surface of a semiconductor wafer, grinding a back surface of the semiconductor wafer, laminating a wafer fixing tape onto the grinded back surface of the semiconductor wafer, and fixing and supporting the semiconductor wafer with a ring frame;

(b): a process of peeling off the surface protective tape from the mask-integrated surface-protective tape to expose the mask material layer to the surface and cutting a region that corresponds to a street by using a laser to make an opening for the street of the semiconductor wafer;

(c): a process of plasma dicing in which plasma is irradiated onto the semiconductor wafer that is to be separated at the street into semiconductor chips; and (d): a process of removing the mask material layer by using a removing agent.

The removing agent is preferably an organic solvent and, more preferably, is selected from the group constituting of methyl ethyl ketone, ethanol, ethyl acetate, and any combination thereof.

It is preferable that the removing agent is supplied from above while rotating the separated semiconductor wafer in the 'process d'.

Hereinafter, some embodiments of the present invention will be described with reference to the accompanying drawings. However, apart from those specified in the present invention, the present invention is not limited to the embodiments described below. Also, embodiments in the drawings are schematically illustrated for ease of understanding the present invention: some of the sizes, thicknesses, or magnitude correlations may have been altered for the convenience of description and does not show the real correlations. The outer forms and shapes of the present invention are also not limited to those illustrated in these drawings except for the matters specified in the present invention.

Also, unless otherwise specifically noted, any commonly used devices and materials that have been conventionally used in semiconductor wafer process can be used as the devices and materials to be used in the embodiments below, and conditions for use thereof can be suitably determined and optimized according to a purpose thereof within a scope of common usage. Also, any redundant descriptions on materials, structures, methods, effects, and so forth that are common among the embodiments will be omitted.

First Embodiment

A first embodiment of the producing method of the present invention will be described with reference to FIG. 1 to FIG. 5. A semiconductor wafer 1 includes a patterned surface 2 on which a semiconductor element circuit or the like is formed on a top surface S thereof (see FIG. 1A). On the side of the patterned surface 2 of the semiconductor wafer 1, a mask-integrated surface-protective tape 3 is pasted (see FIG. 1B). Accordingly, the semiconductor wafer 1 having the patterned surface 2 covered with the mask-integrated surface-protective tape 3 is obtained (see FIG. 1C).

The mask-integrated surface-protective tape 3 includes a surface protective tape 3a, which is a laminate of a substrate film 3aa and a temporary adhesive layer 3ab, and a mask material layer 3b, which is provided on the temporary adhesive layer 3ab. That is, the mask-integrated surface-protective tape 3 has the surface protective tape 3a and the mask material layer 3b that is provided on the surface protective tape 3a. In the mask-integrated surface-protective tape 3, the substrate film 3aa, the temporary adhesive layer 3ab, and the mask material layer 3b may be in a single-layered structure or in double or more layered structure, respectively. The temporary adhesive layer 3ab and the mask material layer 3b are preferably in the single-layered structure. Also, if it is possible to make use of temporary adhesive force of the mask material layer 3b itself, then the temporary adhesive layer 3ab is not always necessary.

Next, a wafer grinding device 12 grinds a back surface B of the semiconductor wafer 1 to make a thickness of the semiconductor wafer 1 thinner (see FIG. 2A). A wafer fixing tape 4 is then pasted onto the grinded back surface B (see FIG. 2B) and the semiconductor wafer 1 is fixed to and supported by the ring frame 13 (see FIG. 2C).

Next, the surface protective tape 3a of the mask-integrated surface-protective tape 3 is peeled off from the semiconductor wafer 1, leaving the mask material layer 3b thereof on the semiconductor wafer 1 (see FIG. 3A) to expose the mask material layer 3b (see FIG. 3B). Then, from a side of the top surface S, a laser L is irradiated onto a plurality of streets (not shown in the drawing) that are formed suitably on the patterned surface 2 in lattice forms or the like to remove parts of the mask material layer 3b that correspond to the streets of the semiconductor wafer 1 and make openings for the streets of the semiconductor wafer 1 (see FIG. 3C). Although it is not limited thereto, a laser such as $CO_2$ laser or YAG laser is applicable for the laser L.

Next, from the side of the top surface S, $SF_6$ gas plasma 15 is irradiated to etch the semiconductor wafer 1 that is exposed at the street parts (see FIG. 4A) and divide the semiconductor wafer 1 into separated semiconductor chips 7 (a plasma dicing process) (see FIG. 4B).

Here, this etching process of a silicon semiconductor wafer using $SF_6$ gas is also called as Bosch process. In this process, the exposed silicon Si is reacted with fluorine atom F generated from $SF_6$ by plasma to form silicon fluoride ($SiF_4$), which is then removed. The process is also called as reactive ion etching (RIE).

Next, a removing agent 16 is supplied from the side of the top surface S (see FIG. 4C). At this time, it is preferable that the semiconductor wafer 1 separated into the chips 7 is rotated at high speed. This can prevent the removing agent 16 from accumulating on the wafer fixing tape 4, reducing influence of the removing agent 16 to the wafer fixing tape 4. Rotating the separated semiconductor wafer 1 at high speed can also facilitates removing of the dissolved or peeled mask material layer 3b from the patterned surface 2 by centrifugal force.

For the removing agent 16, any liquid may be used as long as it can dissolve the mask material layer 3b itself, or it can peel off the mask material layer 3b by reducing adhesive force of an adhesive surface between the mask material layer 3b and the patterned surface 2. For such a removing agent, the removing agent 16 is preferably an organic solvent and, more preferably, is selected from the group constituting of methyl ethyl ketone, ethanol, ethyl acetate, and any combination thereof.

As above, the remaining mask material layer 3b on the top surface S is removed by using the removing agent 16 (see FIG. 5A). And, lastly, a pin 17 pushes up the separated individual chip 7, and a collet 18 sticks to and picks up the chip 7 (see FIG. 5B). Accordingly, a semiconductor chip can be manufactured.

Next, materials to be used in the producing method of the present invention will be described. These materials can also be suitably used in a second embodiment that will be described below. The semiconductor wafer 1 is a silicon wafer or the like, one side of which has the patterned surface 2 where semiconductor element circuit is formed. The patterned surface 2 is a surface on which circuits or the like of semiconductor elements are formed, having streets in a planar view thereof.

(Mask-Integrated Surface-Protective Tape 3)

The mask-integrated surface-protective tape 3 includes the temporary adhesive layer 3ab provided on the substrate film 3aa, and the mask material layer 3b further provided on the temporary adhesive layer 3ab. The mask-integrated surface-protective tape 3 serves as a protector for the semiconductor elements formed on the patterned surface 2. That is, since the mask-integrated surface-protective tape 3 supports the semiconductor wafer 1 at the patterned surface 2 when a back surface of the wafer is grinded in the following wafer thinning process, the mask-integrated surface-protective tape 3 is required to be capable of withstanding this grinding load. Thus, unlike a simple photoresist film or similar, the mask-integrated surface-protective tape 3 has an enough thickness to coat the elements formed on the patterned surface 2, a low pressing resistance, and high adhesion so as to be adhered with the elements as closely as possible to protect infiltration of dust and grinding water.

(Substrate Film 3aa)

The substrate film 3aa of the mask-integrated surface-protective tape 3 is made of material such as plastic or rubber, which can be suitably selected according to the required characteristics from groups of a homopolymer or copolymer of α-olefin such as polyethylene, polypropylene, ethylene-propylene copolymer, polybutane-1, poly-4-methyl pentene-1, ethylene-vinyl acetate copolymer, ethylene-acrylic acid copolymer and an ionomer; a mixture of the above; a simple substance or a mixture of two or more substances of polyethylene terephthalate, polyethylene naphthalate, polyphenylene sulfide, polyether imide, polyimide, polycarbonate, polymethyl methacrylate, polyurethane, stylene-ethylene-butene, pentene copolymer, or the like; and a resin composition of the above added with other resin, fillers, additives, or the like. A laminate of low-density polyethylene and ethylene-vinyl acetate copolymer, a laminate of polypropylene and polyethylene terephthalate, polyethylene terephthalate, or polyethylene naphthalate is one of the suitable materials.

The substrate film 3aa of such materials can be manufactured by using a common extrusion method. If the substrate film 3aa is obtained by laminating various resins, a co-extrusion method, a lamination method, or the like can be used. At this time, an adhesive layer may be provided between resins as commonly done in a generally used manufacturing method of a lamination film. A thickness of such the substrate film 3aa is preferably between 20 and 200 μm in view of strength, expansion property or the like, and radiotransparency.

(Temporary Adhesive Layer 3ab)

The temporary adhesive layer 3ab, together with the mask material layer 3b, improves its adhesiveness with the patterned surface 2 by absorbing the unevenness of the elements formed on the patterned surface 2 and plays a role of protecting the patterned surface 2. To make the mask-integrated surface-protective tape 3 capable of withstanding the load during the wafer thinning process (the back surface grinding process), it is preferable that the adhesiveness between the temporary adhesive layer 3ab and the mask material layer 3b or the substrate film 3aa is high during the wafer thinning process. On the other hand, it is preferable that the adhesiveness between the temporary adhesive layer 3ab and the mask material layer 3b is low (releasability is high) after the wafer thinning process because the temporary adhesive layer 3ab is peeled off together with the substrate film 3aa from the mask material layer 3b.

To achieve such qualities at a high level, it is preferable to use radiation curable temporary adhesive for the temporary adhesive layer 3ab. By using radiation curable temporary adhesive for the temporary adhesive layer 3ab, the temporary adhesive layer 3ab is formed into a three-dimensional network structure by irradiating radioactive rays, reducing the temporary adhesive force of the temporary adhesive layer 3ab. Thus, when radioactive rays are irradiated after wafer thinning process, the strong adhesiveness between the temporary adhesive layer 3ab and the mask material layer 3b is released and the temporary adhesive layer 3ab can be easily removed from the mask material layer 3b (this embodiment will be described in detail below). If the temporary adhesive layer 3ab is a radiation curable temporary adhesive layer, a second embodiment, which will be described below, is preferable for the producing method of the present invention. However, it is not limited to use the radiation curable temporary adhesive for the temporary adhesive layer 3ab in the present invention. Non-radiation curable temporary adhesive (pressure-sensitive adhesive) having a range within the desirable qualities may also be used, and, in such a case, the above-mentioned first embodiment is preferable for the producing method of the present invention. In this description, 'radioactive ray' is used to mean both rays of light, such as ultraviolet rays, and ionizing radiation, such as electron beams. Ultraviolet rays are the preferable radioactive rays to be used in the present invention.

If the temporary adhesive layer 3ab is formed of radiation curable temporary adhesive, a temporary adhesive including acrylic temporary adhesive and radiation polymerizable compound can be suitably used. The acrylic temporary adhesive is (meth) acrylic copolymer or a mixture of (meth) acrylic copolymer and a curing agent. Examples for the (meth) acrylic copolymer are a copolymer including (meth) acrylic acid ester as a constituent and a mixture of two or more copolymers including (meth) acrylic acid ester as constituents. The mass-average molecular weight of such polymers is usually between 300,000 and 1,000,000. A ratio of (meth) acrylic acid ester to all monomer components of the (meth) acrylic copolymer is preferably 70 mol % or more, more preferably 80 mol % or more, and further preferably 90 mol % or more.

Also, if the ratio of (meth) acrylic acid ester to all monomer components of the (meth) acrylic copolymer is not 100 mol %, it is preferable that the rest of the monomer component exists in a form of a copolymer with (meth) acryloyl group as a polymerizable group (a component derived from (meth) acrylic acid or the like). Also, a ratio of (meth) acrylic acid ester having a functional group (hydroxy group, for example) that reacts with a curing agent, which will be described below, to all monomer components of the (meth) acrylic copolymer is preferably 1 mol % or more, more preferably 2 mol % or more, more preferably 5 mol % or more, and further preferably 10 mol % or more. Also, a ratio of the said (meth) acrylic acid ester component is preferably 35 mol % or less and more preferably 25 mol % or less. Also, a ratio of the constituent component (the monomer component) having a functional group (hydroxy group, for example) that reacts with a curing agent, which will be described below, to all monomer components of the (meth) acrylic copolymer is preferably 5 mol % or more, more preferably 10 mol % or more. The upper limit of the said ratio is preferably 35 mol % or less and more preferably 25 mol % or less.

It is preferable that the above (meth) acrylic acid ester component is (meth) acrylic acid alkyl ester (also called as alkyl (meth) acrylate). The number of carbon of alkyl group which constitutes this (meth) acrylic acid alkyl ester is preferably between 1 to 20, more preferably between 1 to 15, and further preferably between 1 to 12.

The curing agent reacts with the functional group in (meth) acrylic copolymer and is used for adjusting temporary adhesive force and cohesive force. Examples of the curing agent are: an epoxy compound having two or more epoxy groups in a molecule such as 1,3-Bis(N,N-diglycidyl aminomethyl)cyclohexane, 1,3-Bis(N,N-diglycidyl aminomethyl)toluene, 1,3-Bis(N,N-diglycidyl aminomethyl)benzene, or N,N,N',N'-tetraglycidyl-m-xylenediamine; an isocyanate compound having two or more isocyanate groups in a molecule such as 2,4-tolylene diisocyanate, 2,6-tolylene diisocyanate, 1,3-xylene diisocyanate, 1,4-xylene diisocyanate, or diphenyl-methane-4,4'-diisocyanate; and an aziridine compound having two or more aziridine functional groups in a molecule such as tetramethylol-tri-β-aziridinyl propionate, trimethylol-tri-β-aziridinyl propionate, or trimethylolpropane-tri-β-(2-methylaziridine) propionate. Amount of the curing agent to be added may be adjusted according to the required temporary adhesive force: 0.1-5.0 pts.mass of the curing agent for 100 pts.mass of (meth) acrylic copolymer is suitable. In the temporary adhesive layer $3ab$ of the mask-integrated surface-protective tape 3 used in the present invention, the curing agent is in a state being reacted with the (meth) acrylic copolymer.

As for the above-mentioned radiation polymerizable compound, a low-molecular-weight compound having at least two or more photo polymerizable carbon-carbon double bonds, which can be formed into a three-dimensional network structure by irradiation of radioactive rays, in a molecule is widely used. Specifically, acrylate compounds such as trimethylol propane triacrylate, tetramethylol methane tetraacrylate, pentaerythritol triacrylate, pentaerythritol tetraacrylate, dipentaerythritol monohydroxy pentaacrylate, dipentaerythritol hexaacrylate, 1,4-butylene glycol diacrylate, 1,6-hexandiol diacrylate, polyethylene glycol diacrylate, or oligoester acrylate can be widely applicable.

Other than the above-mentioned acrylate compounds, urethane acrylate type oligomer can also be used. The urethane acrylate type oligomer can be obtained by reacting terminal isocyanate urethane prepolymer, which can be obtained by reacting a polyester type or polyether type polyol compound with a polyvalent isocyanate compound (for example: 2,4-tolylene diisocyanate, 2,6-tolylene diisocyanate, 1,3-xylene diisocyanate, 1,4-xylene diisocyanate, or diphenyl-methane-4, 4-diisocyanate), with acrylate having a hydroxy group or methacrylate (for example: 2-hydroxyethyl acrylate, 2-hydroxyethyl methacrylate, 2-hydroxypropyl acrylate, 2-hydroxypropyl methacrylate, polyethylene glycol acrylate, polyethylene glycol methacrylate).

A compounding ratio between the acrylic temporary adhesive and the radiation polymerizable compound within the radiation curable temporary adhesive is preferably in a range from 50 to 200 pts.mass, or more preferably from 50 to 150, of the radiation polymerizable compound to 100 pts.mass of the acrylic temporary adhesive. Within this range of the compounding ratio, it is possible to significantly reduce the temporary adhesive force of the temporary adhesive layer $3ab$ after irradiation of radioactive rays.

As the radiation curable temporary adhesive to be used for the temporary adhesive layer $3ab$, it is also preferable to use a radiation polymerizable (meth) acrylic copolymer of which the above (meth) acrylic copolymer itself is radiation polymerizable. In such a case, the radiation curable temporary adhesive may include the curing agent.

The radiation polymerizable (meth) acrylic copolymer is a copolymer of which a copolymer molecule includes a functional group that can react and become polymerized when irradiated by radioactive rays, especially ultraviolet rays. As such a reactive group, an ethylenically unsaturated group, that is a group having a carbon-carbon double bond, is preferable. Examples for such a group are: vinyl group, allyl group, styryl group, (meth) acryloyloxy group, and (meth) acryloylamino group.

Introducing the above-mentioned reactive group into the copolymer can be done by reacting, for example, a copolymer including a hydroxy group with a compound including a group that reacts with the hydroxy group (an isocyanate group, for example) as well as the above-mentioned reactive group (representatively, 2-(meth) acryloyloxy ethyl isocyanate).

Also, a ratio of the monomer component having the above functional group to all monomer components constituting the radiation polymerizable (meth) acrylic copolymer is preferably 2 to 40 mol %, more preferably 5 to 30 mol %, or further preferably 10 to 30 mol %.

Also, when polymerizing and curing the temporary adhesive layer $3ab$ with radioactive rays, a photopolymerization initiator, such as isopropyl benzoin ether, isobutyl benzoin ether, benzophenone, Michler's ketone, chlorothioxanthone, benzyl methyl ketal, α-hydroxy cyclohexyl phenyl ketone, and 2-hydroxy methyl phenyl propane can be used. Adding at least one of the above to the temporary adhesive layer $3ab$ allows the polymerizing reaction to progress efficiently.

The above-mentioned temporary adhesive layer $3ab$ may further include photosensitizer, conventionally known tackifier, softening agent, antioxidant, and the like.

It is also preferable to adopt an embodiment described in Japanese Unexamined Patent Application Publication No. 2014-192204, paragraphs 0036 to 0055 as the temporary adhesive layer $3ab$.

A thickness of the temporary adhesive layer $3ab$ is preferably between 5 and 100 µm, more preferably between 10 and 100 µm, and further preferably between 2 and 50 µm, in view of improving its protection ability of the elements or the like formed on the patterned surface 2 and also improving its adhesiveness with the patterned surface 2. Although it depends on the type of the device, the roughness of the patterned surface is approximately from a few µm to 15 µm. Thus the thickness of the temporary adhesive layer $3ab$ is further preferably between 5 to 30 µm.

(Mask Material Layer $3b$)

The mask material layer $3b$ should not easily damage the semiconductor elements and the like when being pasted onto the patterned surface 2, and should not easily damage the semiconductor elements and the like nor leave residue of temporary adhesive agent on the surface thereof when being removed. A temporary adhesive agent of non-radiation curable type, or so-called pressure-sensitive type, is suitably used for the mask material layer $3b$. As such a pressure-sensitive temporary adhesive agent, a mixture of the above-mentioned (meth) acrylic copolymer and a curing agent can be suitably used.

Also, as the mask material layer $3b$, radiation polymerizable type, such as ultraviolet curable type, in which the mask material layer $3b$ is formed into a three-dimensional network structure by irradiating radioactive rays, or more preferably ultraviolet rays, or ionizing radiation, such as electron beams, curable type can be used.

As such the mask material layer 3b, acrylic temporary adhesive or a mask material including such the acrylic temporary adhesive and a radiation polymerizable compound can be suitably used. The above acrylic temporary adhesive agent is either (meth) acrylic copolymer or a mixture of (meth) acrylic copolymer and a curing agent, and the acrylic temporary adhesive agent described for the above temporary adhesive layer 3ab can be suitably used. In view of adhesiveness, a ratio of (meth) acrylic acid ester component, which includes a functional group (a hydroxy group, for example) that reacts with the curing agent, to all monomer components of the (meth) acrylic copolymer is 0.1 mol % or more and more preferably 0.5 mol % or more. The upper value thereof is preferably 20 mol % or less and more preferably 15 mol % or less. The mass-average molecular weight of the (meth) acrylic copolymer is preferably between 100,000 and 1,000,000.

As described above, a radiation curable type temporary adhesive agent, which is cured by radioactive rays, or a pressure-sensitive temporary adhesive agent, which is not cured by radioactive rays, can be suitably used. As the above radiation curable temporary adhesive agent, a temporary adhesive agent including the above-mentioned acrylic temporary adhesive and an acrylate compound having one or two photo polymerizable carbon-carbon double bonds in a molecule thereof is suitable. In the above radiation curable temporary adhesive agent, the contained amount of the acrylate compound having one or two photo polymerizable carbon-carbon double bonds in a molecule thereof is preferably 15 mass % and more preferably 15 to 70 mass %, and further more preferably 15 to 65 mass %. Also, the acrylate compound having one or two photo polymerizable carbon-carbon double bonds in a molecule thereof is preferably an acrylate compound having one photo polymerizable carbon-carbon double bond in a molecule thereof.

The widely applicable examples for the above acrylate compound having one or two photo polymerizable carbon-carbon double bonds in a molecule thereof are 2-hydroxy-3-phenoxypropyl acrylate, 1,4-butylene glycol diacrylate, 1,6-hexandiole diacrylate, polyethylene glycol diacrylate, and so on. Also, urethane acrylate oligomer having one or two photo polymerizable carbon-carbon double bonds in a molecule thereof can be suitably used: urethane acrylate oligomer obtained by the method described for the above-mentioned temporary adhesive layer 3ab can be favorably used.

A compounding ratio of the acrylic temporary adhesive agent and the acrylate compound having one or two photo polymerizable carbon-carbon double bonds in a molecule thereof within the above radiation curable temporary adhesive agent is preferably in a range from 10 to 250 pts.mass, or more preferably from 15 to 200 pts.mass, of the acrylate compound having one or two photo polymerizable carbon-carbon double bonds in a molecule thereof to 100 pts.mass of the acrylic temporary adhesive agent. With the ratio below the above upper limit, the mask material layer 3b does not deform excessively at the time of the back surface grinding, and thus the damage to the semiconductor wafer 1 can be prevented more effectively.

Also, for the mask material layer 3b, radiation polymerizable (meth) acrylic acid ester copolymer, a photopolymerization initiator, and other components (photosensitizer, conventionally known tackifier, softening agent, antioxidant, and so on) described for the temporary adhesive layer 3ab above can be favorably applied.

In view of further improving its protection ability of the elements formed on the patterned surface 2 and also further improving its adhesiveness with the patterned surface 2 to prevent entry of $SF_6$ gas and to improve removability of the mask material layer 3b, a thickness of the mask material layer 3b of the mask-integrated surface-protective tape 3 of the present invention is preferably between 1 and 100 μm, and more preferably between 5 and 30 μm. Although it depends on the type of the device, the roughness of the patterned surface is approximately from a few μm to 15 μm. Thus the thickness of the mask material layer 3b is more preferably between 5 to 30 μm, and further preferably 5 to 20 μm.

Furthermore, it is preferable that the mask material layer 3b of the mask-integrated surface-protective tape 3 of the present invention has a light transmittance at wavelength of 10 μm and 355 μm (hereinafter, called as the light transmittance$_{10\ \mu m}$ and the light transmittance$_{355\ \mu m}$, respectively) of 70% or less, and a visible light transmittance at wavelength of 400-700 nm (hereinafter, called as the visible light transmittance$_{400\text{-}700\ \mu m}$) of 50% or more. The light transmittance$_{10\ \mu m}$ and the light transmittance$_{355\ \mu m}$ are more preferably 69% or less, and further more preferably 50% or less. There is no lower limit in particular, although it is realistic that the light transmittances are 5% or more. The visible light transmittance$_{400\text{-}700\ \mu m}$ is more preferably 70% or more, and further more preferably 50% or more. There is no upper limit in particular, although it is preferable that the visible light transmittance$_{400\text{-}700\ \mu m}$ is 100% or less.

With the light transmittance$_{10\ \mu m}$ and the light transmittance$_{355\ \mu m}$ being within the above favorable range, the laser can more efficiently cut the parts of the mask material layer 3b that correspond to streets of the semiconductor wafer 1. Also, with the visible light transmittance$_{400\text{-}700\ \mu m}$ within the above favorable range, the patterned surface 2 of the semiconductor wafer 1 can be appropriately recognized and thus errors in recognition during the street opening can be prevented.

The light transmittance is measured as below. First, the mask-integrated surface-protective tape 3 is pasted with an easily-bonded PET film and irradiated by UV light, and then only the surface protective tape 3a is peeled off. The light transmittance of the obtained lamination of the PET film and the mask material layer 3b is measured by using a spectrophotometer (product name: UV-1800 by Shimadzu Corporation), which is then subtracted by the sole light transmittance of the PET film to calculate the light transmittance of the mask material layer 3b.

(Wafer Fixing Tape 4)

The wafer fixing tape 4 supports the semiconductor wafer 1 and is required to have a plasma resistance that can withstand during the plasma dicing process. Also, in the pick up process, the wafer fixing tape 4 is required to have a good pick-up capability and, in some cases, expandability and the like as well. For such the wafer fixing tape 4, the same tape as the above surface protective tape 3a can be used. Also, generally called dicing tape, which is commonly known dicing tape used in conventional plasma dicing method, can be used. Also, to make transition to a die bonding process after the pickup process easier, dicing die bonding tape, which is a laminate of die bonding adhesive agent between the temporary adhesive layer 3ab and the substrate film 3aa can be used.

As for the laser for cutting the mask material layer 3b, a laser irradiation device that irradiates laser beams of ultraviolet or infrared rays can be used. This laser irradiation device has laser irradiation parts that are arranged so as to be able to move along the streets of the semiconductor wafer 1 and can irradiate the laser L of which output power is suitably controlled for removing the mask material layer 3b. Among others, $CO_2$ laser is capable of outputting high power of a several to tens Watt and thus can be suitably used in the present invention.

To perform plasma dicing, a plasma etching device can be used. The plasma etching device is a device capable of dry etching the semiconductor wafer 1, having a closed processing space provided inside a vacuum chamber in which the semiconductor wafer 1 is mounted on a high-frequency side electrode and the plasma generating gas is supplied from a gas supplying electrode that is provided opposite to the high-frequency side electrode. Plasma is generated between the gas supplying electrode and the high-frequency side electrode when high frequency voltage is applied onto the high-frequency side electrode and this plasma is used. A refrigerant is circulated inside the high-frequency electrode, which generates heat, to prevent temperature rising of the semiconductor wafer 1 due to plasma heat.

According to the above method for producing semiconductor chips (the processing method for the semiconductor wafer), since the surface protective tape 3a that protects the patterned surface 2 serves as a mask in plasma dicing process, a photolithography process and the like for providing a photoresist used in the conventional plasma dicing process becomes unnecessary. In particular, by using the surface protective tape 3a, technologies required for high level alignment in printing or transferring to form the mask are unnecessary, so pasting onto the top surface S of the semiconductor wafer 1 is easy and the mask can be formed easily by using the laser device.

Also, the mask material layer 3b can be removed by using the removing agent 16 and thus the mask material layer 3b can be removed without using a special apparatus. In addition, plasma dicing is performed from the side of the patterned surface 2 (the top surface S side) and thus there is no need to turn the chip 7 upside down before the picking operation. For these reasons, the equipment can be simplified and the processing cost can be reduced considerably.

Second Embodiment

Figure 6:
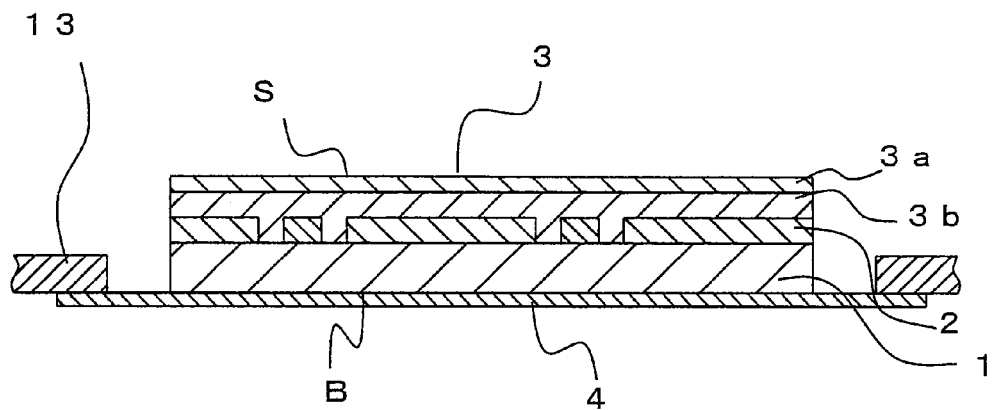
FIG. 6A is a schematic cross sectional view of another embodiment illustrating states before and after a ultraviolet light irradiation process, and is a view showing a state in which each of both front and back surfaces of the semiconductor wafer is covered by a mask-integrated surface-protective tape and fixed by a wafer fixing tape.
FIG. 6B is a view showing a state in which ultra violet light is irradiated.
FIG. 6C is a view showing a state in which a surface-protective tape is peeled off from the mask-integrated surface-protective tape leaving the mask material layer behind.
Figure 6:
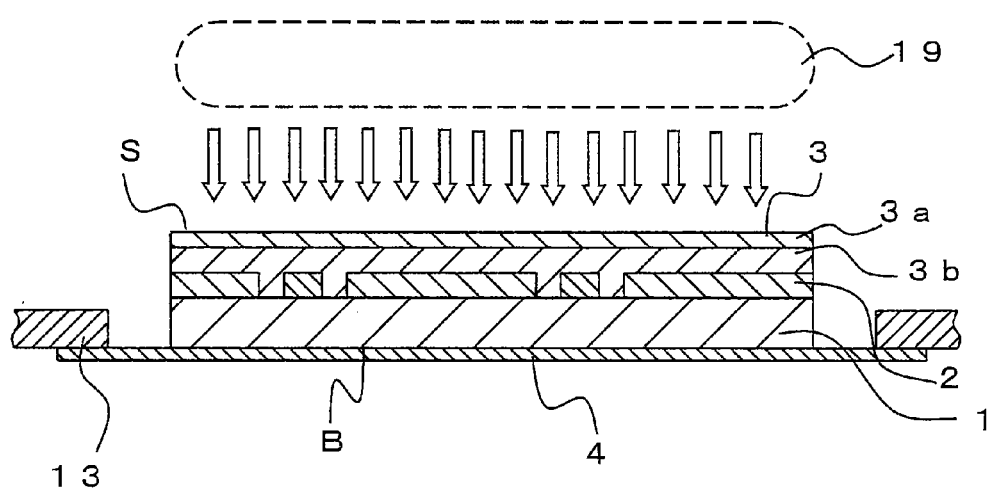
Figure 6:
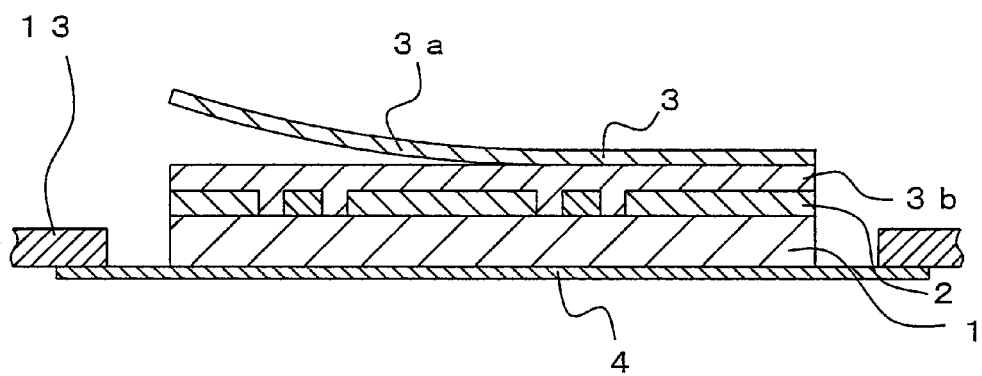

A second embodiment shown in FIG. 6A to 6C is different from the first embodiment in that the second embodiment includes a step of curing the temporary adhesive layer 3ab by irradiating radioactive rays such as ultraviolet rays onto the mask-integrated surface-protective tape 3 before the step of peeling off the surface protective tape 3a in the above-mentioned first embodiment. The other steps are the same as the first embodiment.

That is, firstly, the mask-integrated surface-protective tape 3 is pasted onto a side of the top surface S of the semiconductor wafer 1, the wafer fixing tape 4 is pasted onto the grinded back surface B of the semiconductor wafer 1, and the semiconductor wafer 1 is fixed to and supported by the ring frame 13 (see FIG. 2C and FIG. 6A). After that, ultraviolet rays (UV19) are irradiated toward the mask-integrated surface-protective tape 3 from the side of the top surface S (see FIG. 6B). Then, the temporary adhesive layer 3ab of the mask-integrated surface-protective tape 3 is cured, and then the surface protective tape 3a is removed (see FIG. 6C) to expose the mask material layer 3b. Then it is proceeded to the next step of cutting parts of the mask material layer 3b that correspond to the streets of the semiconductor wafer 1 by the laser L.

The mask-integrated surface-protective tape 3 used in the second embodiment is one of the mask-integrated surface-protective tapes 3 described in the first embodiment, using a material that is curable by radioactive rays, such as ultraviolet rays, for the temporary adhesive layer 3ab. Curing the temporary adhesive layer 3ab by ultraviolet rays or the like facilitates peeling off the surface protective tape 3a from the mask material layer 3b.

Each of the embodiments described above is an example of the present invention and the present invention is not limited thereto. Any additions, eliminations, modifications, and the like of publicly known processes to each of the processes can be performed to the extent not to counter the purpose of the present invention.

WORKING EXAMPLES

Hereinafter, the present invention will be described in further detail based on working examples. However, the present invention is not limited to these examples.

(Surface Protective Tape 3a)

100 pts.mass of an acrylic polymer B (Mw: 350,000, acid value: 7 mgKOH/g, hydroxyl value: 60 mgKOH/g) including constituent elements with respective molar ratio of 74 mol % of lauryl acrylate, 6 mol % of methyl acrylate, and 20 mol % of 2-hydroxy ethyl acrylate is mixed with 1.0 pts.mass of an isocyanate curing agent (product name: L-45 by Tosoh Corporation) to obtain a temporary adhesive composition A.

Separately, the substrate film 3aa is formed from low-density polyethylene (LDPE) resin (product name: Nipolon Hard 205 by Tosoh Corporation) and ethylene-acetate vinyl copolymer (EVA) resin (product name: Ultrathene 540 by Tosoh Corporation) by using an extrusion method to have a thickness of 110 μm.

The above-mentioned temporary adhesive composition A is applied onto the EVA resin layer of the above substrate film 3aa and then dried to form the temporary adhesive layer 3ab with a thickness of 20 μm after drying, and the surface protective tape 3a is obtained.

(Mask Material Layer 3b)

100 pts.mass of an acrylic polymer including constituent elements with respective molar ratio of 80 mol % of 2-ethylhexyl acrylate, 1 mol % of methyl acrylate, and 19 mol % of 2-hydroxy ethyl acrylate is reacted with 2-isocyanate ethyl methacrylate (product name: MOI by Showa Denko K.K) including a photopolymerizable carbon-carbon double bond and an isocyanate functional group in a molecule to obtain an acrylic polymer A (Mw: 750,000, acid value: 6 mgKOH/g, hydroxyl value: 30 mgKOH/g) which includes a photopolymerizable carbon-carbon double bond in a molecule.

The above acrylic polymer A is mixed with 2.0 pts.mass of an isocyanate curing agent (product name: L-45 by Tosoh Corporation) and 5.0 pts.mass of photopolymerization initiator (product name: Esacure KIP 100F by Lamberti) to obtain a mask material composition A.

The above-mentioned mask material composition A is laminated onto the temporary adhesive layer 3ab of the above surface protective tape 3a so that the thickness thereof is 10 μm after being dried, and the mask-integrated surface-protective tape 3 is obtained.

Working Example 1

The semiconductor wafer 1 is processed using the mask-integrated surface-protective tape 3 obtained as above. Methyl ethyl ketone (MEK) as the removing agent 16 for removing the mask material layer 3b is sprayed.

Working Example 2

The mask is removed by using the same method as in Working Example 1, except that ethyl acetate is used as the removing agent 16.

Working Example 3

The mask is removed by using the same method as in Working Example 1, except that ethanol is used as the removing agent 16.

Comparison Example 1

The mask is removed using the same way as Working Example 1 except that an ashing method in which oxide gas is made to be in a plasma state is applied as the removal method.

(Removability Evaluation)

After utilizing the respective removal methods, the surface of the semiconductor wafer 1 is observed under a microscope. Those having the mask material layer 3*b* remaining on the wafer are evaluated as "C" and the others are evaluated as "A".

(Wafer Damage Evaluation)

The surface state of the wafer after mask removal is observed under an optical microscope. Those without any changes after the process is rated "A" and those having roughness on the surface is rated as "C".

TABLE 1

|  | Working Example 1 | Working Example 2 | Working Example 3 | Comparison Example 1 |
|---|---|---|---|---|
| Mask Material Layer | Acrylic | ← | ← | ← |
| Method of Removal | MEK | Methyl Acetate | Ethanol | Ashing |
| Mask Material Layer Removability | A | A | A | A |
| Wafer Damage | A | A | A | C |

From the results, in Working Example 1 to 3 in which the mask material layer 3*b* is removed by using organic solvents as the removing agent 16, there is no damage recognized on the top surface S of the semiconductor wafer 1 after the mask material layer 3*b* is removed. On the other hand, in Comparison Example 1 in which the mask material layer 3*b* is removed by ashing, the top surface S of the semiconductor wafer 1 has a roughness due to the ashing.

Although the embodiments of the present invention have been described referring to the attached drawings, the technical scope of the present invention does not depend on the embodiments described above. It is obvious that persons skilled in the art can think out various examples of changes or modifications within the scope of the technical idea disclosed in the claims, and it will be understood that they naturally belong to the technical scope of the present invention.

What is claimed is:

1. A method for producing semiconductor chips comprising:
    a step a of pasting a mask-integrated surface-protective tape, which includes a surface protective tape and a mask material layer being provided on the surface protective tape, over a patterned surface side of a semiconductor wafer, grinding a back surface of the semiconductor wafer, laminating a wafer fixing tape onto the grinded back surface of the semiconductor wafer, and fixing and supporting the semiconductor wafer with a ring frame;
    a step b of peeling off the surface protective tape from the mask-integrated surface-protective tape to expose the mask material layer, and then cutting a part of the mask material layer that corresponds to a street of the semiconductor wafer by using a laser to make an opening for the street of the semiconductor wafer;
    a step c of plasma dicing wherein plasma irradiation cuts the semiconductor wafer at the street and separates the semiconductor wafer into semiconductor chips; and
    a step d of removing the mask material layer by using a removing agent,
    wherein the removing agent is an organic solvent,
    wherein the mask material layer is an adhesive agent dissolvable in the organic solvent, and
    wherein the mask material layer is non-radiation curable adhesive, and an adhesive layer of the surface protective tape is radiation curable adhesive.

2. The method for producing semiconductor chips according to claim 1, wherein:
    the organic solvent is selected from the group constituting of methyl ethyl ketone, ethanol, ethyl acetate, and any combination thereof.

3. The method for producing semiconductor chips according to claim 1, wherein:
    the removing agent is supplied from above while rotating the separated semiconductor wafer in the step d.

* * * * *